TRANSISTOR CURRENT SWITCHING FOR LOGICAL CIRCUITS

Filed Dec. 5, 1960 2 Sheets-Sheet 1

INVENTORS
CLAUDE J.P.F. LE CAN
CHRISTIAAN DE RUYTER
BY
Frank R. Jifani
AGENT

TRANSISTOR CURRENT SWITCHING FOR LOGICAL CIRCUITS

Filed Dec. 5, 1960 2 Sheets-Sheet 2

INVENTORS
CLAUDE J.P.F. LE CAN
CHRISTIAAN DE RUYTER
BY
AGENT

United States Patent Office 3,142,764
Patented July 28, 1964

3,142,764
TRANSISTOR CURRENT SWITCHING FOR LOGICAL CIRCUITS

Claude Jean Principe Frederic Le Can and Christiaan de Ruyter, both of Nijmegen, Netherlands, assignors to North American Philips Company, Inc., New York, N.Y., a corporation of Delaware Filed Dec. 5, 1960, Ser. No. 73,683
Claims priority, application France Dec. 8, 1959
9 Claims. (Cl. 307—88.5)

Figures 1, 3:
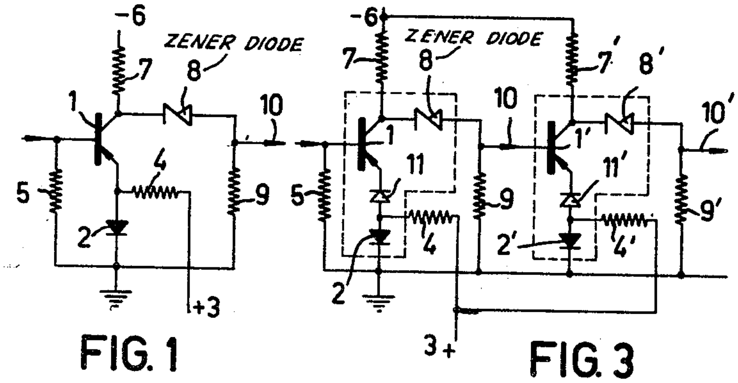

This invention relates to a logical system, in particular to a logical current system including a transistor, with means for supplying control pulses to the base of the transistor, and supply means for the emitter-collector circuit of the transistor.

Such devices are known and described in particular in "I.R.E. Transactions on Circuit Theory" CT–4, Number 3 of September 1957, pages 236–240 and "Proceedings of the I.R.E.," of June 1958, pages 1240–1254. The latter article describes inter alia transistor devices with direct coupling for logical systems (pages 1250–1252 and pages 1252–1254) and in addition, as well as the former article, transistor devices for logical current systems.

In the introduction of the former article, the author, Hannon S. Yourke, states five principal factors which limit the speed of the transistor circuits:

(1) The delays due to accumulations of charge carriers which occur when the transistors operate in a region with saturation phenomena;
(2) The limits determined by the capacitances of the circuits and of the transistors;
(3) The limit frequency of the collector-base-current amplification factor;
(4) The delay due to diffusion time or transit time of the charge carriers in the transistor;
(5) The delay due to accumulation of charge carriers in diodes which may form part of the device described.

According to Yourke, it is advisable first to prevent the operation of the transistors in saturation or even approximately in saturation. In his opinion, already a comparatively weak forward voltage between the collector and the base reduces the bandwidth which the transistor can transmit. In case the transistors are used outside their saturation region and have a sufficiently high limit frequency, for example of the order of several hundreds of mc./s., the principal limit is that determined by the capacitances of the circuits and of the transistors; when using current logic, which renders it possible to operate with signals of weak amplitude, the unfavorable effects of these capacitances can be reduced to a great extent.

In the second article, the authors, Henle and Walsh, point out on page 1242 that the curves of constant limit frequency as a function of the collector current $I_c$ and of the collector-base voltage $V_{cb}$ (FIGURE 5) have the form of hyperbolas and that, at a given voltage $V_{cb}$, the comparatively low limit frequency at a collector current which is zero or approximately zero first increases rapidly, reaches a maximum, and then decreases again when the collector current continues to increase. These curves are also represented by a straight load curve on page 1253 (FIGURE 47). The authors note that along this straight line and with the exception of the region of weak collector current where the frequency is low, the operating point of the transistor remains in a region where its limit frequency is high.

In the circuit arrangements described by Henle and Walsh and also by Yourke, the emitter current of each transistor in the "off" condition is zero. Yourke says (page 240, first column) that, in accordance with the type of transistor used, a weak blocking bias voltage may be required to remove the said emitter current in the "off" condition and that, if this bias voltage is higher, the danger of an insulation breakdown between the base and the emitter and of an associated emitter-reverse current should be taken into account.

The object of the present invention is to make a better use of the comparatively high limit frequencies of the transistors at intermediate values of the collector currents and also to remove the difficulties which may be associated with the use of an initial reverse voltage possibly required between the base and the emitter thereof, the object of which voltage is to keep the transistor in the "off" condition.

The device according to the invention is characterized in that it includes, in addition to the transistor and the control and supply means mentioned above, means to apply a weak forward bias voltage between the base and the emitter of the transistor, and in that the said bias and supply means are constructed and proportioned so that, at a first level of the input signal consisting of the said control pulses, the collector current of the transistor reaches a rest value larger than the value of its cut-off current and that, at another level of the input signal, this collector current is considerably larger than the said rest current and remains smaller than the value at which the collector-base voltage changes sign.

In other words, the transistor is operated in class A while operation in its saturation region or even in the proximity of this region is avoided.

In a particular embodiment of the device according to the invention, the biasing means include a non-linear element connected in the emitter circuit of the transistor and a forward current source connected to this element and to the emitter, the supply means including a source of reverse voltage connected to the collector of the transistor.

Preferably and in accordance with known general measures, described in particular in the above articles, the said non-linear element is a semi-conductor element, for example, a transistor or a diode which is connected in the reverse direction with respect to the emitter current of the transistor; this element, however, has a threshold voltage lower than that of the parallel circuit comprising the emitter-base path of the transistor. As a result of this, in the "off" condition substantially the entire current supplied by the source of direct current flows through the circuit comprising the said semi-conductor element, the voltage drop at the terminals of this circuit maintaining the transistor biased in the forward direction.

One may take such steps that with the current supplied by the said source of direct current, the circuit including the semi-conductor element exhibits a voltage drop higher than the threshold voltage of the parallel circuit including the emitter-base path of the transistor. In the "off" condition of the transistor, this path is biased in the forward direction by the voltage drop at the terminals of the parallel circuit including the semi-conductor element.

In the second article, Henle and Walsh state on page 1252 that one of the drawbacks of the transistor devices with direct coupling for logical systems consists in that the transistors used should have characteristic parameters with narrow tolerances. In the devices for logical systems described by Yourke and also by Henle and Walsh, this drawback is partially removed by preventing the transistor from operating in its saturation region or in the proximity of this saturation region and by including in the input and output circuits of each device a circuit point maintained at a reference potential; in principle this reference potential does not vary.

The present invention also provides means to increase the threshold voltage of the circuit including the emitter-base path of the transistor. These means comprise a threshold diode, preferably a silicon diode for a germanium transistor of the type alloyed by diffusion, whereby this diode is connected in the forward direction in series with the said emitter-base path and preferably between the said forward current source and the emitter of the transistor. In addition to the desired increase of the threshold voltage of the circuit including the emitter-base path of the transistor, the theshold diode has a double effect:

(1) It renders possible the use of transistors having characteristic parameters with far wider tolerance limits, the threshold voltage of the transistors not being critical at all because the difference between the different threshold voltages of the circuit including the emitter-base path and of the circuit including the semi-conductor element referred to hereabove can easily be doubled, trebled or even quadrupled.

(2) The threshold voltage diode protects the emitter-base path and prevents any breakdown of this path owing to too strong pulses of comparatively large amplitude and reverse polarity. In this respect, it should be remarked that this voltage can be rather weak, especially in the case of high-frequency transistors of the type alloyed by diffusion.

In case the above semi-conductor element has to fulfil no other task but fixing the potential of the emitter of the transistor when the latter is in the "off" condition, this element can be a diode in accordance with the teachings of Henle and Walsh. In particular, it can preferably be a germanium diode.

Figure 4:
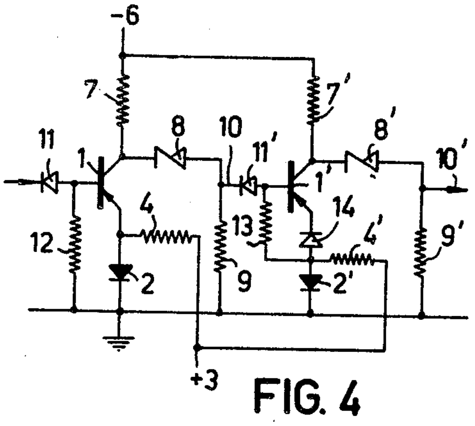

On the other hand, as described in the article by Yourke on pages 237 and 238 and in FIGURE 4, the device according to the invention may include coupling means to bring the signals produced at the collector of the transistor back to a level which substantially corresponds to that of the signals supplied to the base of the transistor. These means preferably include a diode connected in the reverse direction between the common point of the collector of the transistor and of a resistor via which this collector is fed from the said source of reverse voltage and an output terminal connected to a point of constant potential via a second resistor. The reverse breakdown voltage (Zener voltage) of this coupling diode may be chosen so that a reverse discharge current invariably flows through the said diode and that, consequently, the current supplied by the source of reverse voltage is invariably larger than the collector current of the transistor.

The preferred embodiment of the device according to the invention also includes a transistor, a semi-conductor element to set the potential of the emitter of the transistor when the latter is in the "off" condition, a threshold diode and a coupling diode. This device forms an extremely practical, so to say universal structural unit for building logical systems, in particular logical current systems. In view of the very wide admissible tolerances for the characteristic parameters of the transistors, of the biasing semi-conductor elements, of the threshold diodes and of the coupling diodes, the device described is excellently suited for mass production, for example in the form of a block having a common protective envelope consisting, for example, of synthetic material, in which the transistor, the semi-conductor element and the threshold and coupling diodes are enclosed.

In addition, the invention comprises gates, bistable trigger circuit arrangements and further parts of logical systems including several devices of the type described, as well as logical systems with such parts and/or such devices.

Figure 2:
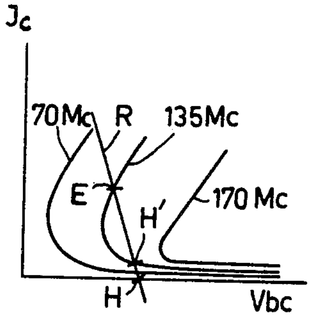
Figure 5:
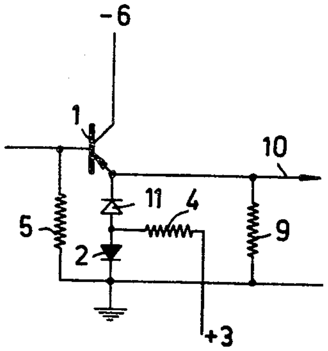
Figure 6:
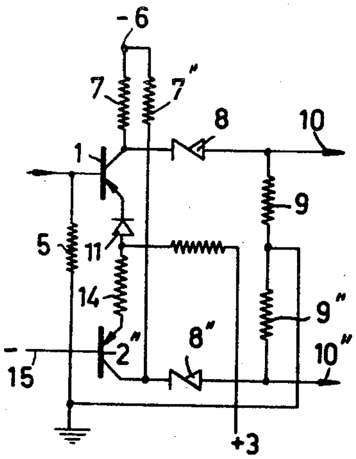
Figure 7:
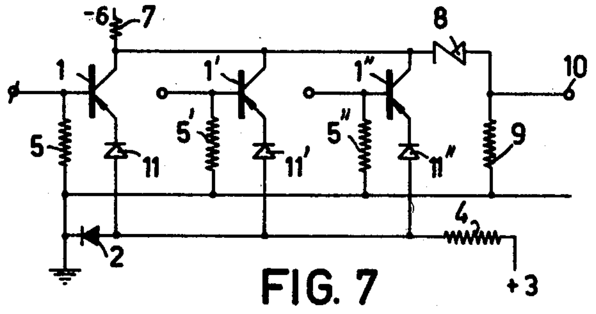
Figure 8:
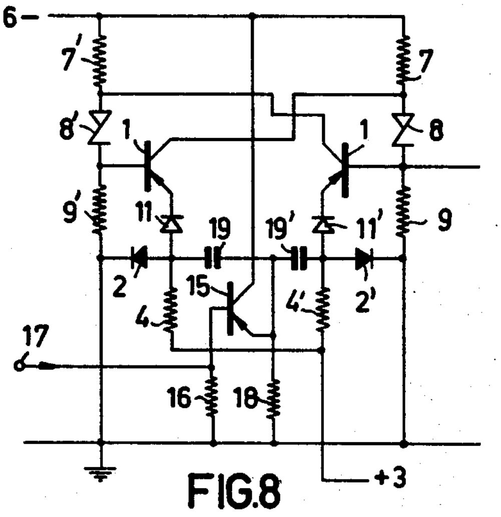
Figure 9:
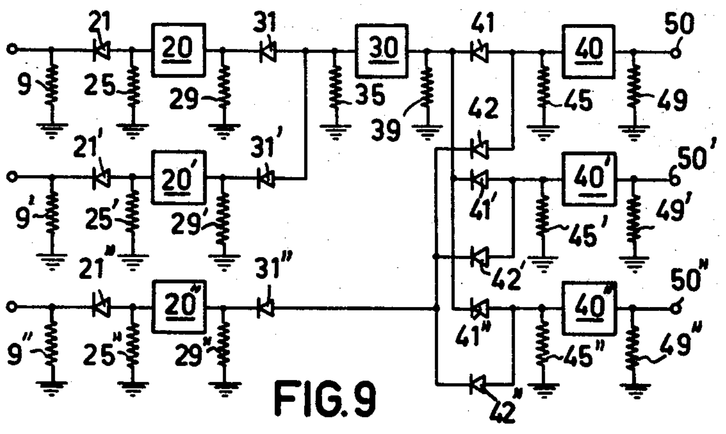

In order that the invention may be readily carried into effect, it will now be described in greater detail by way of example, with reference to the accompanying drawings, in which FIGURE 1 is a circuit diagram of a first embodiment, FIGURE 2 is a diagram illustrating the operation of the emobdiment shown in FIGURE 1, FIGURE 3 is a circuit diagram of a preferred modification of this embodiment and shows the cascade arrangement of two devices, FIGURE 4 is a circuit diagram of a second modification of the said embodiment adapted for use in a logical system with diodes, FIGURE 5 is the circuit diagram of a second embodiment in which the signal is not reversed, FIGURE 6 is the circuit diagram of a third embodiment with two complementary outputs, FIGURE 7 is the circuit diagram of a system including several devices as shown in FIGURE 3 forming an "or" gate, FIGURE 8 is the circuit diagram of a trigger circuit arrangement including two devices as shown in FIGURE 3, and FIGURE 9 is a principal circuit diagram of a logical system with diodes provided with device as shown in FIGURE 4.

The embodiment shown in FIGURE 1 includes a transistor 1 of the pnp-type, preferably a high-frequency diffusion junction transistor, for example a germanium transistor. A germanium diode 2 is connected in the reverse direction in the emitter-earth circuit of this transistor. According to the invention, this diode has a lower threshold voltage than the emitter-base path of the transistor 1. A source of direct current, comprising a suitable voltage source 3 in series with a resistor 4, is connected between earth and the common point of the emitter connection of the transistor 1 and of the diode 2 and feeds the parallel circuit including the diode 2 and the emitter circuit of the transistor 1. The base of the transistor 1 is connected to earth via a resistor 5 and its collector is also fed from a source of reverse current comprising a voltage source 6 and a resistor 7 connected in series between this collector and earth. The collector of the transistor 1 is also connected to a coupling diode 8, the other terminal of which is connected to earth via a load resistor 9.

The current supplied by the source is substantially determined by the value of the resistor 4. If, for example, the source 3 has a voltage of 6 v. and the resistor 4 a value of 1 kohm, this current amounts to approximatelly 6 ma. Assuming the threshold voltage of the emitter-base path of the transistor 1 to be larger than that of the diode 2 and the potential applied to the base of the transistor to be zero, the current supplied by the source 3 substantially flows through the diode 2.

The source 6 also supplies a current substantially determined by the resistor 7. Assuming, for example, this source to be a voltage source of 40 v. and the resistor 7 to have a value of 5.6 kohms, this current amount to approximately 7 ma.

Under the above conditions, the collector current of the transistor 1 corersponds to its collector-base leakage current $I_{co}$ or is only slightly higher. The diode 8 has a breakdown voltage or Zener voltage far below 40 v., so that the current of 7 ma. supplied by the source 6 flows in the reverse direction through this diode and through the resistor 9, at the terminals of which it produces a voltage drop, whereby the output terminal 10 is brought to a comparatively high negative potential of, for example, −1.4 v.

If a negative potential of, for example, −1.2 v. is applied to the base of the transistor 1, the transistor becomes conductive. The junction point of its emitter and of the diode 2 is thus brought to a negative potential somewhat lower than the potential applied to its base, which is sufficient to cut off the diode 2, so that the whole current supplied by the source flows through the circuit of the transistor 1. Under such conditions, the collector current substantially corresponds to 6 ma. and the current flowing through the Zener diode 8 amounts to no more than approximately 1 ma., whereby the output terminal 10 is brought to a potential of −0.2 v.

This current logic device is known per se. However, it does not take advantage of the high-frequency properties of the employed transistor as completely as might be desirable, for example in the case of computers operating with very high frequencies.

FIGURE 2 is a graphical representation taken from the above article by Henle and Walsh and showing the limit frequency of the collector-emitter-current amplification factor of a transistor as a function of its base-collector voltage and of its collector current. This graphical representation also shows a load line R which intersects the axis of the voltages at a point H (off) corresponding to the collector supply voltage and which intersects a curve corresponding to a limit frequency of 135 mc./s. at a point E, which point corresponds, for example, to a high current of 6 ma. of the transistor 1 shown in FIGURE 1. The maximum value of the current of the transistor 1 is limited to that of the source 3 and the minimum value of its collector-base voltage is also limited by the fact that the source 6 supplies more current than the source 3, so that the collector-earth voltage remains higher than the Zener voltage of the diode 8, which is itself higher than the maximum negative voltage which can be applied between the base of the transistor and earth. The point E can thus be chosen favourably, for example so that, along the greater part of its load line, the transistor 1 operates in a region in which its limit frequency is equal to or higher than 135 mc./s.

When the transistor 1 is non-conductive (point H in FIGURE 2), its limit frequency is, however, far lower than 135 mc./s. and even lower than 70 mc./s. This effect is ascribed to the comparatively high capacitance of the transition layer of the emitter of the transistor, which capacitance is principally effective and harmful when the transistor is non-conductive or only very weakly conductive.

The transistor might also form an even more rapid and more effective element of a device for a logical system if, in such a device, it could operate in class A, that is to say, for example between the points H' and E of FIGURE 2.

In the device shown in FIGURE 1, the operation in class A can be secured, due to the fact that, at the value of the current flowing through the diode 2 when the transistor is least conductive, the voltage drop at the terminals of this diode is larger than the threshold voltage of the emitter-base path of the transistor. As a result, this voltage drop of, for example, 0.8 v. biases the emitter-base path of the transistor in the forward direction, so that its emitter-collector circuit is also somewhat conductive. The current flowing through the diode will amount to, for example, 5 ma. and the emitter current of the transistor is stabilized at approximately 1 ma. by the difference between the respective voltage drops at the terminals of the diode and of the emitter-base path of the transistor and by the resistor 5 in the base circuit of this transistor. From this it appears that the current flowing through the diode 8 consequently fluctuates between 6 ma. and 1 ma., so that the voltage at the output terminal 10 fluctuates between −1.2 and −0.2 and is sufficient to control a corresponding device connected in cascade with the shown device.

Practical mass production of the device shown in FIGURE 1 encounters difficulties due to the tolerances and variations with time of the various threshold values of the transistors and diodes. As a result of these difficulties, it is necessary to select the transistors and also to select the diodes for each batch of selected transistors. These difficulties are apparently even more serious if the transistor is to be operated in class A because, in this case, the tolerances and variations of the internal resistance of the diode at a comparatively high current value are to be taken into account. The voltage drop at the terminals of the diode when conductive can, however, easily be increased by means of a resistor connected in series with this diode.

In order to avoid the above difficulties with respect to tolerances and variations, according to a characteristic feature of the invention a threshold diode is connected in the forward direction in series with the emitter-base path of the transistor, as shown, for example, in FIGURE 3. This diode is preferably a silicon diode with a comparatively high threshold voltage. It has a double task:

First: it frees the manufacturer of transistors, diodes and finished devices from every trouble as regards the threshold voltages of the employed transistors and diodes. In fact, it is always possible to choose, for the threshold diode, a diode of a type, the threshold voltage of which is always higher than that of the type chosen for the diode 2, so that in any case the threshold voltage of the circuit including the threshold diode and the emitter-base path of the transistor will always be higher than the threshold voltage of the diode 2. Secondly: the threshold diode 11 very effectively protects the base-emitter path of the transistor 1 against any breakdown in case too high a reverse voltage might occur at its base. The reverse breakdown voltage of the base-emitter path of a high-frequency transistor, and in particular of a diffusion junction transistor, is indeed lower and well of the order of 1 or of a few volts. In contrast therewith, the reverse breakdown voltage or Zener voltage of the threshold diode, for example of a rapid silicon diode, is comparatively high, for example higher than 50 v.

In the variant shown in FIGURE 3, the device includes a threshold diode 11 connected in the forward direction in the emitter connection of the transistor 1, between this emitter and the junction point of the diode 2 and of the resistor 4.

According to a characteristic feature of the invention, the semi-conductor elements of the device surrounded by broken lines in FIGURE 3 and including the transistor 1, the diode 2, the coupling diode 8 and the threshold diode 11, are enclosed in a common protective envelope, for example embedded in synthetic material. This protective envelope may also enclose the resistors of the device, for example the resistors 4, 5 and 7 or 5, 7 and 9 of FIGURE 1, or the corresponding resistors of one of the devices shown in FIGURE 3.

In the modification shown in FIGURE 4, the threshold diode 11 is connected between the input terminal of every device and the base of the corresponding transistor 1. If required, this diode can thus simultaneously serve as element of a logical system with diodes, to connect together two or more than two devices. In this case, it is necessary to connect the junction point of the diode 11 and of the base of the transistor to earth or, via a leakage resistor 12 or 13 to the junction point of the diode 2 and of the resistor 4. The resistor 12 or 13 of course reduces the effect of the threshold diode 11 with respect to the setting of the operating point of the transistor 1 in the "off" condition and, in order to obtain the same insensitivity with respect to tolerances as in the modification shown in FIGURE 3, it is recommendable to use a second threshold diode 14 connected between the emitter of the transistor 1 and the junction point of the diode 2 and of the resistor 4, as shown in the right-hand part of FIGURE 4.

FIGURE 5 shows a second embodiment of the device according to the invention, in which the collector of the transistor 1 is directly connected to the source 6 of reverse voltage and the output terminal 10 is directly connected to the emitter of this transistor. This device does consequently not reverse the received signal and the voltage amplification is somewhat lower than 1, so that the number of such devices which can be connected in cascade without intermediate voltage amplification, is restricted. The base and emitter circuits further correspond to those of the devices shown in FIGURE 3.

The source 3 is a voltage source of 3 v., the resistor 4 has a value of approximately 1000 ohms, the source 6 is a voltage source of —2 v., and the charging resistor 9 has a value of 200 ohms.

When the negative potential applied to the base of the transistor 1 is weak, for example of the order of —0.2 v., the greater part of the current supplied by the source 3, for example a current of 2.5 ma., will flow through the diode 2, while the current flowing through the threshold diode 11 amounts to approximately 0.5 ma. The emitter current of the transistor 1 corresponds to the sum of the current of 0.5 ma. flowing through the threshold diode 11 and of the current through the charging resistor 9. The latter current in its turn depends on the potential of the emitter of the transistor 1. It is assumed that this potential amounts to —0.1 v. and that the emitter-base voltage of the transistor, corresponding to a current of the order of 1 ma., amounts to 0.1 v. The load current then also amounts to 0.5 ma. The voltage at the terminals of the threshold diode amounts to 0.6 v. and that at the terminals of the diode 2 is 0.5 v.

When the negative voltage applied to the base of the transistor 1 is large, for example of the order of —1.2 v., the potential of the emitter of the transistor falls to approximately —1.05 v., so that the current flowing through the load resistor 9 is approximately 5 ma. and the current through the threshold diode 11 is approximately 3 ma. With this current, the voltage drop at the terminals of the threshold diode amounts to 0.72 v., so that the diode 2 is cut off by a negative voltage of —0.33 v.

The voltages transmitted to the output terminal 10 are thus —0.1 v. for an input voltage of —0.2 v., the transistor 1 being in the "off" condition (point H' in FIGURE 2), and —1.05 v. for an input voltage of —1.2 v., the transistor being in the "on" condition (point E in FIGURE 2).

In the third embodiment shown in FIGURE 6, the diode 2 is replaced by a resistor 14 in series with the emitter-base path of a second transistor 2'' of the same conductivity type as the transistor 1. The base of this transistor is connected to a source 15 of constant negative bias voltage, of, for example, —0.9 v.; its collector is fed from the source 6 via resistor 7'' and is coupled to a second output terminal 10'' via a coupling diode 8'', the said output terminal being connected to earth via a resistor 9''.

When the negative voltage applied to the base of the transistor 1 is weak, for example of the order of —0.2 v., the greater part of the current supplied by the source 3, for example a current of 5 ma., flows via the resistor 14 and the emitter-collector path of the transistor 2''. The resistor 14 is chosen such that a potential of approximately +0.55 v. appears at the junction point of the threshold diode 11 and of this resistor, for example of 260 ohms. Under these conditions, a weak current, for example of the order of 10 μa., flows via the base-emitter path of the transistor 1, and the emitter current of this transistor via the threshold diode 11 amounts to approximately 1 ma.

The voltage at the output terminal 10 is comparatively strongly negative and can be adjusted at, for example, —1.4 v. by varying the resistor 7 or the voltage of the source 6. The voltage at the second output terminal 10'' is, however, weakly negative, for example of —0.2 v.

When the negative voltage applied to the base of the transistor 1 is high, for example —1.4 v., the conditions are inverted: the transistor 1 supplies a current of approximately 5 ma., the potential at the junction point of the diode 11 and of the resistor 14 is of approximately —0.2 v. and a comparatively weak current, for example a current of approximately 1 ma., flows through the resistor 14 and the emitter-collector path of the transistor 2''.

Under these conditions, the potential at the output terminal 10 is —0.2 v. and that at the second output terminal 10'' is approximately —1.4 v.

It is to be noted that the transistors 1 and 2'' both operate in class A. It is clear that a variable bias voltage can also be applied to the base of the transistor 2'', so that the output voltage depends on the simultaneous occurrence of two conditions. For example, a weak voltage at the terminal 10 and a strong voltage at the terminal 10'' is obtained only when the value of the negative bias voltage applied to the base of the transistor 2'' is smaller than that of the comparatively high negative voltage applied to the base of the transistor 1. A comparison device for the weak voltages or an "and" gate circuit can thus be realized in this manner. The transistor 2'' can also be cut off by a positive bias voltage of some tenths of a volt applied to its base, the transistor 1 becoming strongly conductive: an "or" gate circuit can thus be realized.

If only one of the output terminals 10 and 10'' is used, the coupling members of the other of these terminals can naturally be omitted: either the coupling diode 8 and the load resistor 9, or the diode 8'' and the resistor 9''. The current supplied by the source 6, will then, however, vary by the same value as the collector current of the transistor 1 or 2'' respectively, instead of remaining substantially constant.

FIGURE 7 is the circuit diagram of a system with devices of the type described with reference to FIGURE 3, which forms an "or" gate with three inputs. The diode 2, the direct voltage source 3, the resistor 4, the source of reverse voltage 6, the resistor 7, the coupling diode 8, the load resistor 9 and the output terminal 10 are common for the three devices employed, which comprise the transistors 1, 1' and 1'', the input resistors 5, 5' and 5'', and the threshold diodes 11, 11' and 11''.

A negative pulse applied to the base of one of the transistors 1, 1' and 1'' is transmitted to the output terminal 10 in reversed form. A negative pulse simultaneously applied to the base of one or of each of the two other transistors is inoperative, because the comparatively strong current supplied by one transistor is sufficient to cut off the diode 2.

The "or" gate circuit of FIGURE 7 is shown only by way of example. It is clear that the device according to the invention may be used in any gate circuit or in another logical device.

FIGURE 8 is the circuit diagram of a trigger circuit having two devices of the type described with reference to FIGURE 3 and of a driving stage which complements this trigger arrangement to form a stage of a binary counter.

The trigger circuit arrangement includes two devices 1, 2, 4, 7, 8, 9 and 1', 2', 4', 7', 8', 9', in which the base of the transistor 1 is connected to the junction point of the coupling diode 8 and of the load resistor 9' of the device with the transistor 1' and the base of this transistor is connected to the junction point of the diode 8 and the resistor 9 of the device with the transistor 1. The two devices are supplied from the same sources 3 and 6 of direct voltage and reverse voltage respectively.

Under these conditions, it is clear that, when the diode 2 is conductive, the junction point of the elements 8 and 9 is comparatively negative, so that the transistor 1' is well conductive and the diode 2'' is cut off ("off" condition). When, in contrast therewith, the diode 2 is cut off, the junction point of the elements 8 and 9 is weakly negative, so that the transistor 1' is weakly conductive and the diode 2' is conductive ("on" condition). The trigger circuit arrangement is thus bistable.

The driving stage includes a third transistor 15, the base of which is connected to an input terminal 17 and to earth via a resistor 16. The collector of this transistor is directly connected to the source 6 of reverse voltage and its emitter is connected to earth via a load resistor 18. The junction point of the emitter of the transistor 15 and of the resistor 18 is coupled to the junction point of the diodes 2 and 11 and of the resistor 4 via a capacitor 19, and to the junction point of the diodes 2' and 11' and of the resistor 4 via a capacitor 19'.

Normally, the transistor 15 is non-conductive since its base has substantially the same potential as its emitter. When a negative pulse is applied to the input terminal 17, a negative pulse of substantially the same amplitude is produced at the terminals of the load resistor 18 by the current supplied by the transistor 15 and flowing via this resistor.

When, for example, the diode 2′ was conductive before the supply of the input pulse ("on" condition), whereby the transistor 1′ was weakly conductive, the transistor 1 strongly conductive and the diode 2 non-conductive, the negative pulse supplied to the junction points of the diodes 2 and 11 and of the diodes 2′ and 11′ will immediately cut off the transistor 1, without changing the condition of the diode 2, and also cuts off the transistor 1′ and the diode 2′. However, since the transistor 1′ was initially only weakly conductive, the negative pulse produced at its collector on cutting off the transistor 1′ and transmitted to the base of the transistor 1 will have a smaller amplitude than the pulse produced by the same input pulse at the collector of the initially strongly conductive transistor 1 and supplied to the base of the transistor 1′. On the other hand, the diode 2 was initially blocked, while the diode 2′ was initially conductive. As a result of this, the blocking of the diode 2′ occurs with a certain delay due to its dynamic capacitance, that is to say, due to the free charge carriers accumulated in this diode and which initially even permit the passage of a short reverse current pulse across the said diode 2′. The base of the initially strongly conductive transistor 1 consequently receives a weak negative, somewhat delayed and rounded-off pulse, while the base of the initially weakly conductive transistor 1 receives a strong and undelayed negative pulse. The latter transistor immediately becomes strongly conductive after the pulse has been produced at the emitter of the transistor 15, while the transistor 1 becomes weakly conductive, so that the diode 2 becomes conductive. This mode of operation is based on the difference between the respective behaviours on flipping over of the germanium diodes 2 and 2′ respectively on the one hand, and of the silicon diodes 11 and 11′ respectively and of the high-frequency transistors 1 and 1′ respectively on the other hand. The condition of the diode 2 is not subject to reversal while the condition of the diode 2′ undergoes a reversal. Since, in the above initial conditions, this diode is the slowest element of the trigger circuit arrangement, this element would return to its initial condition last of all and it consequently remains in the reversed condition.

It is to be noted that the trigger circuit arrangement is insensitive to positive pulses produced by differentiation on return of the transistor 15 to its initial non-conductive condition. These pulses are indeed very strongly attenuated because the circuit of the emitter of the transistor 1′ or 1 is strongly conductive, respectively because the circuit of the emitter of the transistor 1 or 1′ is weakly conductive and the circuit of the associated likewise conductive diodes 2 or 2′ has a very small impedance for such pulses.

FIGURE 9 is the principal circuit diagram of a logical system with diodes which includes a number of devices of the type shown in FIGURE 4, for example in the right-hand part of this figure. This system includes three stages in cascade-arrangement and respectively consisting of three devices 20, 20′ and 20″ with their input resistors 25, 25′ and 25″ and their output resistors 29, 29′ and 29″, a device 30 with its input resistor 35 and its output resistor 39, and three devices 40, 40′ and 40″ with their input resistors 45, 45′ and 45″ and their output resistors 49, 49′ and 49″.

Three input circuits with the respective output resistors 9, 9′ and 9″ of preceding devices are respectively coupled to the input circuits of the devices 20, 20′ and 20″ via diodes 21, 21′ and 21″, which can also serve as threshold diodes for these devices.

The output circuits of the devices 20 and 20′ are coupled to the input circuit of the device 30 via the diodes 31 and 31′ which can also serve as threshold diodes for this device.

The output circuit of the device 30 is coupled to the input circuits of the devices 40, 40′ and 40″, via diodes 41, 41′ and 41″ which can serve as threshold diodes for these devices.

The output circuit of the device 20″ is also coupled to the input circuits of the devices 40, 40′ and 40″ via a diode 31″ in series with separate diodes 42, 42′ and 42″ which can serve as threshold diodes for the devices 40, 40′ and 40″.

Finally, the output circuits of the devices 40, 40′ and 40″ are respectively connected to the output terminals 50, 50′ and 50″.

It is to be noted that, in the proposed system, each of the devices 30, 40, 40′ and 40″ with their input diodes 31 and 31′ respectively 41 and 42, 41′ and 42′ or 41″ and 42″ fulfils a logical function "or" and that each of the devices 20″ and 30 controls the three devices 40, 40′ and 40″ of the last stage.

The system shown in FIGURE 9 is described only to give a better understanding of the use of the devices according to the invention in a logical system with diodes.

The invention is of course not restricted to the devices, the gate, the trigger circuits or the logical system which have been described, but it includes any embodiment or modification of such devices, gates, trigger circuits and logical systems which are provided with such devices.

What is claimed is:

1. A transistor switching circuit, comprising a transistor having base-, emitter- and collector-electrodes and a base-emitter threshold voltage, input means for supplying forward control pulses to said base electrode, a source of reverse voltage connected to the collector electrode of said transistor for supplying current to the emitter-collector circuit of the transistor, a semi-conductor element having at least two electrodes and a threshold voltage, said element being connected in the emitter circuit of the transistor with its electrodes connected in the reverse direction with respect to the emitter-current of the transistor, a source of forward current coupled to the electrode of said semi-conductor element closest to the emitter of the transistor, and a threshold diode connected in the pass direction with respect to the emitter-current in the emitter-base circuit of said transistor, the respective values of said base-emitter threshold voltage and of the respective threshold voltages of the semi-conductor element and of said threshold diode being such that the sum of the base-emitter threshold voltage of the transistor and of the threshold voltage of the threshold diode is larger than the threshold voltage of the semi-conductor element, but smaller than the voltage drop produced across the semi-conductor element by the current supplied to the semi-conductor element by the source of forward current.

2. A transistor switching circuit as claimed in claim 1, wherein said semi-conductor element comprises a second transistor of the same conductivity type as said transistor, the emitter of said second transistor being coupled through a resistive element to said source of forward current.

3. A transistor switching circuit, comprising a transistor having base-, emitter- and collector-electrodes and a base-emitter threshold voltage, input means for supplying forward control pulses to said base electrode, a source of reverse voltage connected to the collector electrode of said transistor for supplying current to the emitter-collector circuit of the transistor, a semi-conductor element having at least two electrodes and a threshold voltage, said element being connected in the emitter circuit of the transistor with its electrodes connected in the reverse direction with respect to the emitter-current of the transistor, a source of forward current coupled to the electrode of said semi-conductor element closest to the emitter of the transistor, and a threshold diode connected in the pass direction with respect to the emitter-current between the emitter electrode of the transistor and a common point of said closest electrode of the semi-conductor element and said source of forward current, the respective values of said base-emitter threshold voltage and of the respective threshold voltages of the semi-conductor element and of said threshold diode being such that the sum of the base-emitter threshold voltage of the transistor and of the threshold voltage of the threshold diode is larger than the threshold voltage of the semi-conductor element, but smaller than the voltage drop produced across the semi-conductor element by the current supplied to the semi-conductor element by the source of forward current.

4. A device as claimed in claim 3, said transistor being a germanium transistor of the type alloyed by diffusion, said semi-conductor element being a germanium element and said threshold diode being a silicon diode.

5. A device as claimed in claim 3, wherein said source of reverse voltage is connected to the collector of the transistor via a supply resistor, and further including a Zener diode connected between an output terminal and the common point of the collector electrode of the transistor and of said supply resistor, said output terminal being connected to a point of constant potential via a second resistor and said transistor, said semi-conductor element, said threshold diode and said Zener diode being enclosed in a common protective envelope.

6. A transistor switching circuit, comprising a transistor having base-, emitter- and collector-electrodes and a base-emitter threshold voltage, input means for supplying forward control pulses to said base electrode, a source of reverse voltage connected to the collector electrode of said transistor for supplying current to the emitter-collector circuit of the transistor, a semi-conductor element having at least two electrodes and a threshold voltage, said element being connected in the emitter circuit of the transistor with its electrodes connected in the reverse direction with respect to the emitter-current of the transistor, a source of forward current coupled to the electrode of said semi-conductor element closest to the emitter of the transistor, and a threshold diode connected in the pass direction with respect to the emitter-current between the base electrode of the transistor and said input means, the respective values of said base-emitter threshold voltage and of the respective threshold voltages of the semi-conductor element and of said threshold diode being such that the sum of the base-emitter threshold voltage of the transistor and of the threshold voltage of the threshold diode is larger than the threshold voltage of the semi-conductor element, but smaller than the voltage drop produced across the semi-conductor element by the current supplied to the semi-conductor element by the source of forward current.

7. A device as claimed in claim 6, said transistor being a germanium transistor of the type alloyed by diffusion, said semi-conductor element being a germanium element and said threshold diode being a silicon diode.

8. A device as claimed in claim 6, wherein said source of reverse voltage is connected to the collector of the transistor via a supply resistor, and further including a Zener diode connected between an output terminal and the common point of the collector electrode of the transistor and of said supply resistor, said output terminal being connected to a point of constant potential via a second resistor and said transistor, said semi-conductor element, said threshold diode and said Zener diode being enclosed in a common protective envelope.

9. A logical system including a plurality of devices as claimed in claim 6, said devices being intercoupled via their respective threshold diodes, said diodes operating as elements of a voltage logic arrangement and each device coupled to more than one source of input pulses having a corresponding number of threshold diodes.

References Cited in the file of this patent

UNITED STATES PATENTS

| | | |
|---|---|---|
| 2,880,330 | Linvill et al. | Mar. 3, 1959 |
| 2,945,134 | Moody et al. | July 12, 1960 |
| 2,947,882 | Chou | Aug. 2, 1960 |
| 2,964,652 | Yourke | Dec. 13, 1960 |
| 3,011,065 | Carey | Nov. 28, 1961 |